(12) United States Patent
Nagata et al.

(10) Patent No.: US 8,771,496 B2
(45) Date of Patent: Jul. 8, 2014

(54) PROCESS FOR PRODUCING METAL COMPOSITE FILM

(75) Inventors: Eiji Nagata, Yokohama (JP); Hiroyuki Ishii, Tsukuba (JP)

(73) Assignee: PI R&D Co., Ltd., Yokohama-Shi (JP)

( * ) Notice: Subject to any disclaimer, the term of this patent is extended or adjusted under 35 U.S.C. 154(b) by 1082 days.

(21) Appl. No.: 12/227,330

(22) PCT Filed: May 17, 2006

(86) PCT No.: PCT/JP2006/309813
§ 371 (c)(1),
(2), (4) Date: Mar. 13, 2009

(87) PCT Pub. No.: WO2007/132529
PCT Pub. Date: Nov. 22, 2007

(65) Prior Publication Data
US 2009/0311519 A1 Dec. 17, 2009

(51) Int. Cl.
C23C 28/02 (2006.01)
C23C 18/31 (2006.01)
C25D 7/00 (2006.01)
B32B 15/08 (2006.01)
B32B 15/20 (2006.01)
B32B 27/06 (2006.01)

(52) U.S. Cl.
USPC .......... 205/184; 205/187; 205/164; 205/167; 205/169

(58) Field of Classification Search
None
See application file for complete search history.

(56) References Cited

U.S. PATENT DOCUMENTS

| | | | | |
|---|---|---|---|---|
| 3,573,973 | A * | 4/1971 | Drotar | 427/97.5 |
| 4,992,144 | A * | 2/1991 | Walsh et al. | 205/138 |
| 5,478,462 | A * | 12/1995 | Walsh | 205/169 |
| 6,589,662 | B1 * | 7/2003 | Itatani et al. | 428/473.5 |

FOREIGN PATENT DOCUMENTS

| | | | |
|---|---|---|---|
| JP | 4-207094 A | | 7/1992 |
| JP | 10-81747 A | | 3/1998 |
| JP | 11-80390 A | | 3/1999 |
| JP | 2000-80165 A | | 3/2000 |
| JP | 2000-255013 A | | 9/2000 |
| JP | 2002-363284 A | | 12/2002 |
| JP | 2003-031924 | * | 1/2003 |
| JP | 2003-231208 A | | 8/2003 |
| JP | 2003-306649 A | | 10/2003 |
| JP | 2004-130748 A | | 4/2004 |
| JP | 2004-189981 A | | 7/2004 |
| JP | 2004-322578 A | | 11/2004 |
| JP | 2004-339526 A | | 12/2004 |
| JP | 2005-88465 A | | 4/2005 |
| JP | 2006-068986 | * | 3/2006 |
| JP | 2007-31622 A | | 2/2007 |
| WO | WO 2005/053368 A1 | | 6/2005 |

OTHER PUBLICATIONS

Machine Translation, Watanabe et al., JP 2006-068986, Mar. 2006.*
Machine Translation, Izumida et al., JP 2003-031924, Jan. 2003.*
D. Scola, "Polyimide Resins," in ASM Handbook, vol. 21: COMPOSITES, D. Miracle and S. Donaldson, eds., 2001 (no month), pp. 105-119.*
Extended European Search Report, dated Apr. 2, 2012, for European Application No. 06746516.1.
Office Action for Japanese Application No. 2004-320141, dated Dec. 1, 2009.
Office Action for Japanese Application No. 2008-515415, dated Jul. 19, 2011.

* cited by examiner

*Primary Examiner* — Michael E La Villa
(74) *Attorney, Agent, or Firm* — Birch, Stewart, Kolasch & Birch, LLP

(57) ABSTRACT

A metal composite film having an excellent heat resistance and adhesion, suited for flexible printed circuit boards capable of forming fine wirings, as well as a production process thereof, is disclosed. The metal composite film comprises an insulating film; a thermoplastic polyimide layer(s) formed on at least one surface of the insulating film; and metal layers formed on the surface of each of the thermoplastic polyimide layer(s), which metal layers are formed by electroless plating and then by electrolytic plating, respectively. Since this metal composite film has an excellent heat resistance and adhesion, and maintains the excellent adhesion after forming fine wirings, it is suitably used as a high density flexible printed circuit board having fine circuits.

6 Claims, No Drawings

# PROCESS FOR PRODUCING METAL COMPOSITE FILM

TECHNICAL FIELD

The present invention relates to a metal composite film which can be used as a flexible printed circuit board, which is excellent in the adhesion between the metal and the insulating layer, and in the adhesion of fine wirings.

BACKGROUND ART

Flexible printed circuit boards having a three-layered structure of insulating substrate/adhesive/metal foil, using as the adhesive an epoxy, acrylic, polyamide, phenol adhesive or the like, are well known. In these flexible printed circuit boards, since the heat resistance and adhesion of the metal layer are determined by the properties of the adhesive, they have a problem in heat resistance. Flexible printed circuit boards wherein a precursor of a thermoplastic polyimide is used as an adhesive for increasing heat resistance, and wherein a metal foil is heat-pressed at a high temperature, are known (Patent Literatures 1 and 2). However, these flexible printed circuit boards have a problem of residual strain after processing because the metal foil needs to be heat-pressed at a high temperature, and a problem in that patterning with a small pitch is difficult because the thickness of the metal foil used for the heat-press is usually not less than 10 µm.

Flexible printed circuit boards having a bilayered structure produced by directly forming a metal layer by sputtering or electroless plating on an insulating film, for example, a non-thermoplastic polyimide film or aramide film, and then forming a metal layer by electrolytic plating are known. These flexible printed circuit boards have a drawback in that adhesion is poor, especially decrease in adhesion after heat load is large.

Flexible printed circuit boards produced by forming a thermoplastic polyimide layer on a non-thermoplastic polyimide, sputtering copper on the surface of the thermoplastic polyimide layer, and forming a metal layer by electrolytic plating are also known (e.g., Patent Literature 3). However, these flexible printed circuit boards have a problem in that the adhesion of fine wirings is poor.
Patent Literature 1: JP 4-146690 A
Patent Literature 2: JP 2000-167980 A
Patent Literature 3: JP 2003-251773 A
Patent Literature 4: WO99/19771

DISCLOSURE OF THE INVENTION

Problems to be Solved by the Invention

An object of the present invention is to provide a metal composite film for flexible printed circuit boards having an excellent heat resistance and adhesion, capable of forming fine wirings, as well as a production process thereof.

Means for Solving the Problems

As a result of intensive study, the present inventors discovered that a metal composite film having an excellent heat resistance and adhesion, suited for flexible printed circuit boards capable of forming fine wirings can be obtained by forming a thermoplastic polyimide layer(s) on at least one surface of the insulating film; forming metal layers on each of the thermoplastic polyimide layer(s) by electroless plating and then by electrolytic plating, respectively, thereby reaching the present invention.

That is, the present invention provides a metal composite film comprising an insulating film; a thermoplastic polyimide layer(s) formed on at least one surface of the insulating film; and metal layers formed on the surface of each of the thermoplastic polyimide layer(s), which metal layers are formed by electroless plating and then by electrolytic plating, respectively. The present invention also provides a process for producing a composite metal film, which process comprising the steps of forming a thermoplastic polyimide layer(s) on at least one surface of the insulating film; forming a first metal layer on each of the thermoplastic polyimide layer(s) by electroless plating; and forming a second metal layer on each of the first metal layer(s) by electrolytic plating.

Effects of the Invention

Since the metal composite film of the present invention is excellent in heat resistance and adhesion as well as adhesion after forming fine wirings, it is suitably used as a high density flexible printed circuit board having fine circuits, so that the industrial practicality of the metal composite film according to the present invention is very high.

BEST MODE FOR CARRYING OUT THE INVENTION

The insulating film used in the present invention is not restricted as long as the film is insulative. Preferred examples of the material thereof include polyethylene terephthalate; polynaphthalene terephthalate; polyphenylene sulfide; polyphenylene ether resins; polyamide resins; aromatic polyamide resins such as ARAMICA (produced by Teijin Advanced Films Limited) and the like; polyimide resins such as non-thermoplastic polyimide series of trade name "KAPTON" (produced by Du Pont-Toray Co., Ltd., produced by DuPont), non-thermoplastic polyimide series of trade name "UPILEX" (produced by Ube Industries, Ltd.), non-thermoplastic polyimide series of trade name "APICAL" (produced by Kaneka Corporation) and the like; fluorocarbon polymers such as tetrafluoroethylene resins, fluorinated ethylene propylene copolymer resin, perfluoro alkoxy resins and the like; liquid crystal polymers such as trade name "VECSTAR" (produced by Kuraray Co., Ltd.) and the like.

The thickness of the insulating film is not restricted, and preferably 5 to 500 µm, more preferably 5 to 125 µm.

As the thermoplastic polyimide used in the present invention, a solvent-soluble polyimide resin is preferably used. The term "solvent-soluble" herein means that the polyimide can be dissolved in N-methyl-2-pyrrolidone (NMP) at a concentration of not less than 5% by weight, preferably not less than 10% by weight. In cases where the insulating film is made of a material having a high heat resistance, such as a polyimide resin, the thermoplastic polyimide layer can be formed by applying a solution of the polyamic acid which is a precursor of the thermoplastic polyimide, and then carrying out a ring closure reaction by dehydration under heat. However, taking the cases into consideration where the solution is applied to a material having a poor heat resistance, the method wherein a polyimide solution is applied and dried can be employed to a wider variety of insulating films.

The solvent-soluble polyimide can be produced by a direct imidization reaction between a diamine component(s) and a tetracarboxylic dianhydride(s) (Patent Literature 4). Preferred examples of the tetracarboxylic dianhydrides (described in the form of monomers) constituting the polyimide include 3,4,3',4'-biphenyl tetracarboxylic dianhydride, 3,4,2', 3'-biphenyl tetracarboxylic dianhydride, 3,4,3',4'-diphenylether tetracarboxylic dianhydride, 3,4,3',4'-diphenylsulfone tetracarboxylic dianhydride, benzophenone tetracarboxylic dianhydride, bis(dicarboxyphenyl)propane anhydride, pyromellitic acid, 4,4'-(2,2-isopropylidene)diphthalic acid dianhydride, bicyclo[2,2,2]oct-7-ene-2,3,5,6-tetracarboxylic dianhydride and the like.

Preferred examples of the diamine components (described in the form of monomers) constituting the polyimide include 3,3'-dicarboxyl-4,4'-diaminodiphenylmethane, 3,5-diaminobenzoic acid, 2,4-diaminophenyl acetic acid, 2,5-diaminoterephthalic acid, 1,4-diamino-2-naphthalene carboxylic acid, 2,5-diamino-n-valeric acid, 1,4-diaminobenzene, 1,3-diaminobenzene, 2,4-diaminotoluene, 4,4'-diaminodiphenylmethane, 3,4'-diaminodiphenyl ether, 4,4'-diaminodiphenyl ether, 3,3'-dimethyl-4,4'-diaminobiphenyl, 2,2'-dimethyl-4,4'-diaminobiphenyl, 4,4'-diaminobenzophenone, 3,3'-diaminobenzophenone, 4,4'-bis(4-aminophenyl)sulfide, 4,4'-diaminodiphenyl sulfone, 4,4'-diaminobenzanilide, 9,9-bis(4-aminophenyl)fluorene, 1,4-bis(4-aminophenoxy)benzene, 1,3-bis(4-aminophenoxy)benzene, 4,4'-bis(4-aminophenoxy)biphenyl, 4,4'-bis(3-aminophenoxy)biphenyl, 2,2-bis(4-aminophenoxyphenyl)propane, bis[4-(4-aminophenoxy)phenyl]sulfone, 2,2-bis[4-(4-aminophenoxy)phenyl]hexafluoropropane, 3,3'-dicarboxy-4,4'-diaminodiphenylmethane, 3,3',5,5'-tetramethyl-4,4'-diaminodiphenylmethane, 3,3',5,5'-tetraethyl-4,4'-diaminodiphenylmethane, 3,3'-diethyl-5,5'-dimethyl-4,4'-diaminodiphenylmethane, 3,3'-dihydroxy-4,4'-diaminobiphenyl, hexamethylenediamine, isophorone diamine, 1,3-bis(3-aminopropyl)-1,1,3,3-tetramethyldisiloxane, α,ω-bis(3-aminopropyl)polydimethylsiloxane and the like.

The polyimide to be used preferably comprises carboxyl groups because the polyimide has an especially excellent heat resistance and adhesion. The polyimide comprising carboxyl groups can be produced by using a diamine component(s) having a carboxyl group(s). Examples of these diamine components include 3,3'-dicarboxyl-4,4'-diaminodiphenylmethane, 3,5-diaminobenzoic acid, 2,4-diaminophenyl acetic acid, 2,5-diaminoterephthalic acid, 1,4-diamino-2-naphthalene carboxylic acid, 2,5-diamino-n-valeric acid and the like.

The tetracarboxylic dianhydride component(s) preferably comprise(s) bicyclo[2,2,2]oct-7-ene-2,3,5,6-tetracarboxylic dianhydride because the polyimide has an especially excellent heat resistance and adhesion.

The direct imidization reaction between the diamine component(s) and the tetracarboxylic dianhydride component(s) can be carried out using a catalyst system employing the following equilibrium reaction between a lactone, base and water.

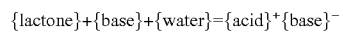
{lactone}+{base}+{water}={acid}$^+${base}$^-$

A polyimide solution can be obtained by heating the reaction mixture at 120° C. to 200° C. using the {acid}$^+${base}$^-$ system as a catalyst. The water produced by the imidization reaction is eliminated from the reaction system by azeotropic distillation with toluene. When the imidization in the reaction system is completed, {acid}$^+${base}$^-$ is converted to the lactone and the base, and they lose the catalytic activity and are removed from the reaction system. The polyimide solution produced by this process can be industrially used as it is as a polyimide solution with high purity because the above-mentioned catalytic substances are not contained in the polyimide solution after the reaction. Alternatively, an acid catalyst such as p-toluenesulfonic acid or the like may also be used.

Examples of the reaction solvent which may be used in the above-mentioned imidization reaction include, in addition to the above-mentioned toluene, polar solvents which dissolves polyimide, such as N-methyl-2-pyrrolidone, dimethylformamide, dimethylacetamide, dimethyl sulfoxide, sulfolane, tetramethylurea, γ-butyrolactone and the like. An ester solvent(s), ketone solvent(s), or an ether solvent(s) may also be employed in combination. Preferred examples of the ester solvents include methyl benzoate and the like; preferred examples of the ketone solvent include methyl ethyl ketone, methyl propyl ketone, methyl isopropyl ketone, methyl butyl ketone methyl isobutyl ketone, methyl-n-hexyl ketone, diethyl ketone, diisopropyl ketone, diisobutyl ketone, cyclopentanone, cyclohexanone, methylcyclohexanone, acetylacetone, diacetone alcohol, cyclohexene-n-one, and the like; and preferred examples of the ether solvents include dipropyl ether, diisopropyl ether, dibutyl ether, tetrahydrofuran, tetrahydropyran, ethyl isoamyl alcohol, ethyl-t-butyl ether, ethyl benzyl ether, diethylene glycol dimethyl ether, cresyl methyl ether, anisole, phenetole and the like.

As the lactone, γ-valerolactone is preferred. As the base, pyridine and/or methylmorpholine is(are) preferred.

The mixing ratio (acid(s)/diamine(s)) of the tetracarboxylic dianhydride(s) and diamine(s) subjected to the above-described imidization reaction is preferably about 1.05 to 0.95 by mole. Further, the concentration of the acid dianhydride based on the total reaction mixture is preferably about 4 to 16% by weight, the concentration of the lactone is preferably about 0.2 to 0.6% by weight, the concentration of the base is preferably about 0.3 to 0.9% by weight, and the concentration of the toluene is preferably about 6 to 15% by weight at the initiation of the reaction. The reaction time is not restricted and varies depending on the molecular weight of the polyimide to be produced and the like, and usually about 2 to 10 hours. It is preferred to carry out the reaction under stirring.

It should be noted that the production process per se of the polyimide using the binary catalytic system comprising the lactone and the base is known, and described in, for example, Patent Literature 4.

By carrying out the above-described imidization reaction sequentially in two steps using different acid dianhydrides and/or different diamines, polyimide block copolymers can be produced. By the conventional process for producing polyimide through polyamic acid, only random copolymers can be produced as copolymers. Since polyimide block copolymers can be produced selecting arbitrary acids and/or diamines, desired properties or functions such as adhesiveness, dimensional stability, low dielectric constant and the like can be given to the polyimide. In the present invention, such a polyimide copolymer may preferably be employed.

Preferred processes for producing the polyimide block copolymers include the process wherein a polyimide oligomer is produced using the acid catalyst generated by the above-described lactone and the base, and using either one of the aromatic diamine component or the tetracarboxylic dianhydride in excess, and then the aromatic diamine and/or the tetracarboxylic dianhydride is(are) added (the molar ratio of the total aromatic diamines to the total tetracarboxylic dianhydrides is 1.05 to 0.95), thereby carrying out two-step polycondensation.

The thermoplastic polyimide used in the present invention preferably has a weight average molecular weight of not less than 50,000 from the viewpoint of film-forming property, and preferably has a weight average molecular weight of not more than 300,000 from the viewpoint of the viscosity of the coating solution. The numbers of moles of the tetracarboxylic dianhydride(s) and the diamine(s) are not necessarily equal for the control of molecular weight. The ends of the resin may be capped with an acid anhydride such as maleic anhydride or phthalic anhydride, or with a monoamine such as aniline.

The thermoplastic polyimide layer in the present invention can easily be formed by coating the polyimide solution obtained by the above-described method on the surface of the insulating film and drying the coated solution. The coating may be carried out by various methods such as those using a reverse roll, rod (bar), blade, knife, comma, die, lip, gravure, rotary screen and the like, respectively. The drying may be carried out by using any apparatus which can apply a heat sufficient for the removal of the solvent used, such as a hot air dryer or infrared dryer. The thermoplastic polyimide layer in the present invention has a thickness (after drying) of preferably 1 to 20 μm, more preferably 2 to 10 μm. If the thickness is less than 1 μm, the effect of the resin layer is not obtained sufficiently, so that the adhesion is decreased. On the other hand, if the thickness is more than 20 μm, the dimensional change or the solder heat resistance after moisture absorption is degraded, which is problematic.

The metal used for the metal layer in the present invention is not restricted as long as it is a practical metal for forming wirings, and copper is preferably employed. Although a metal layer can be formed by various methods, in the present invention, a first metal layer is formed on the thermoplastic polyimide layer by electroless plating, and then a second metal layer is formed on the thus formed first metal layer by electrolytic plating.

The method of electroless plating per se is well-known, and various solutions for electroless plating are commercially available. In the present invention, these commercially available solutions may preferably be employed. For example, after treatment with a desmear solution DS-250 and with a neutralization-reduction solution DS-350, treatments with predip solution PI-3000, catalyst solution PI-3500, accelerator solution PI-4000, respectively, may be performed, all of these products being produced by EBARA-UDYLITE CO., LTD. Thereafter, an electroless plated coating copper layer may be deposited by dipping the resulting film in an electroless copper plating solution PI-5000. The thickness of the first metal layer formed by the electroless plating is not restricted, and usually about 0.1 μm to 1.0 μm.

The method of electrolytic plating per se is well-known, and various solutions for electrolytic plating are commercially available. In the present invention, these commercially available solutions may preferably be employed. For example, after treatment with an acidic degreasing solution PB-242D produced by EBARA-UDYLITE CO., LTD., acid activation may be performed, and then electrolytic plating may be performed using Cu-Brite TH-RII (trade name). By controlling the current density and time for plating, a copper layer having an arbitrary thickness can be obtained.

The thickness of the metal layers formed by the above-described electroless plating and electrolytic plating, respectively, (total thickness of the metal layers formed by both of the plating) is preferably 1 to 40 μm from the viewpoint of a conductivity appropriate as a wiring and from the viewpoint of appropriate flexibility.

EXAMPLES

The present invention will now be described more concretely by way of examples thereof. However, the present invention is not restricted to the Examples below.

Synthesis Example 1

To a 2 L three-necked separable flask equipped with a stainless steel anchor agitator, an inlet tube for introducing nitrogen gas and a condenser comprising a trap and a cooling tube having balls are attached, and the reaction is carried out under nitrogen gas flow. Bicyclo[2,2,2]oct-7-ene-2,3,5,6-tetracarboxylic dianhydride in an amount of 44.9 g (200 mmol), 15.22 g (100 mmol) of 3,5-diaminobenzoic acid, 3.0 g (30 mmol) of γ-valerolactone, 3.6 g (40 mmol) of pyridine, 300 g of N-methylpyrrolidone and 60 g of toluene were added and the resulting mixture was allowed to react at 180° C. for 1 hour under nitrogen gas flow. The azeotrope between water and toluene was eliminated. To this reaction solution, 29.4 g (100 mmol) of 3,4,3',4'-biphenyltetracarboxylic dianhydride, 58.46 g (200 mmol) of 1,3-bis-(3-aminophenoxy)benzene, 268 g of N-methylpyrrolidone and 40 g of toluene were added, and the resulting mixture was allowed to react at room temperature for 1 hour under nitrogen gas flow. The reaction was continued at 180° C. for another 3 hours while eliminating the azeotrope between toluene and water. The obtained polyimide had a number average molecular weight of 58,900 and a weight average molecular weight of 95,000, in terms of polystyrene. This polyimide had a glass transition temperature of 213° C. to 226° C. and a thermal decomposition starting temperature of 422° C. The concentration of the polyimide in the obtained polyimide solution was 19.5% by weight.

Example 1

The thermoplastic polyimide solution obtained in Synthesis Example 1 was coated on KAPTON 100EN (trade name, produced by Du Pont-Toray Co., Ltd.) to a thickness after drying of 5 μm with a reverse roll coater to form a thermoplastic polyimide layer. Using a commercially available electroless plating kit (produced by EBARA-UDYLITE CO., LTD.), electroless copper plating was carried out according to the steps shown in Table 1, and then electrolytic copper plating was carried out according to the steps shown in Table 2 using a commercially available apparatus and kit (produced by EBARA-UDYLITE CO., LTD.) to obtain a metal composite film according to the present invention having a thickness of the metal layers of 12 μm. The evaluation results thereof are shown in Table 3. The names of various solutions shown in Tables 1 and 2 are trade names of EBARA-UDYLITE CO., LTD.

Example 2

The same operations as in Example 1 were repeated except that APICAL 25NPI (trade name, produced by Kaneka Corporation) was used in place of KAPTON 100EN (trade name) to obtain a metal composite film according to the present invention.

The same operations as in Example 1 were repeated except that UPILEX 25SGA (trade name, produced by Ube Industries, Ltd.) was used in place of KAPTON 100EN (trade name) to obtain a metal composite film according to the present invention.

TABLE 1

Electroless Copper Plating Process
(Chemicals used here were produced by EBARA-UDYLITE CO., LTD.)

| Step | Chemical | Concentration | Conditions |
|---|---|---|---|
| Desmear | DS-250 A | 20 g/L | 70° C., 2 min |
| | SS-400 | 16 mL/L | |
| Neutralization/Reduction | DS-350 | 50 mL/L | 50° C., 1 min |
| | 98% $H_2SO_4$ | 50 mL/L | |
| Predip | PI-3000 | 25 mL/L | 35° C., 10 sec |
| Catalyst | PI-3500 | 250 mL/L | 50° C., 1 min |
| | SS-400 | 1 mL/L | |
| Accelerator | PI-4000 | 10 mL/L | 35° C., 1 min |
| | PC-BA | 14 g/L | |
| Electroless Copper Plating | PI-5000A | 100 mL/L | 35° C., 5 min |
| | PI-5000B | 100 mL/L | |
| | PI-5000C | 100 mL/L | |
| | PI-5000S | 10 mL/L | |

Note)
Washing with water between any of the steps except between predip-catalyst are included.

TABLE 2

Electrolytic Copper Plating Step
(Chemicals used here were produced by EBARA-UDYLITE CO., LTD.)

| Step | Chemical | Concentration | Conditions |
|---|---|---|---|
| Acid Degreasing | PB-242D | 100 mL/L | 50° C., 1 min |
| Acid Activation | 10% $H_2SO_4$ | | R.T., 30 sec |
| Electrolytic Copper Plating | Cathode electric current density | | 2 A/dm$^2$, 25° C., 40 min |
| | Copper sulfate | 75 g/L | |
| | Sulfuric acid | 180 g/L | |
| | Chloride ion | 40 mg/L | |
| | Cu-Brite TH-R II | 25 mL/L | |
| | STB | 0.5 mL/L | |

Note)
Washing with water between the steps are included.

Comparative Example 1

The same operations as in Example 1 were repeated except that the thermoplastic polyimide layer was not formed on KAPTON 100EN to obtain a metal composite film. The evaluation results of the obtained metal composite film are shown in Table 3.

Comparative Example 2

On KAPTON 100EN, an Ni thin layer with a thickness of 10 nm was formed by sputtering, and then a copper thin layer with a thickness of 200 nm was formed by sputtering on the Ni layer. Thereafter, a copper plating layer with a thickness of 12 μm was formed by electrolytic plating. The evaluation results are shown in Table 3.

Comparative Example 3

A metal composite film having a metal layer with a thickness of 12 μm was obtained by the method described in Patent Literature 3. The evaluation results are shown in Table 3.

TABLE 3

Results of Evaluation

| Item | Unit | Example 1 | Example 2 | Example 3 | Comparative Example 1 | Comparative Example 2 | Comparative Example 3 |
|---|---|---|---|---|---|---|---|
| Normal peel strength | kN/m | 1.2 | 1.2 | 1.0 | ≤0.1 | 0.6 | 0.9 |
| Line-to-line insulation resistance | $10^{17}$ Ω | 1.7 | 1.7 | 1.8 | X | X | $10^{14}$ |
| Solder heat resistance after moisture absorption | — | good | good | good | not good | not good | slight foaming |

Line-to-line insulation resistance: L/S = 50 μm,
X: could not be measured because the pattern could not be formed
Solder heat resistance after moisture absorption: D-2/100 + 60 s/280° C.

The invention claimed is:

1. A process for producing a composite metal film, which process comprising the steps of:
    forming a thermoplastic polyimide layer on at least one surface of an insulating film;
    forming a first copper layer by electroless plating so that the first copper layer is disposed directly on said thermoplastic polyimide layer; and
    forming a second copper layer directly on said first copper layer by electrolytic plating, wherein
    said thermoplastic polyimide layer comprises a polyimide resin having carboxyl groups, wherein
    said thermoplastic polyimide layer is formed by applying a solvent-soluble polyimide solution on the insulating film and drying the solution, and wherein
    said thermoplastic polyimide is a polyimide obtained by polycondensation between a tetracarboxylic dianhydride component(s) including at least bicyclo[2,2,2]oct-7-ene-2,3,5,6-tetracarboxylic dianhydride and a diamine component(s) including at least a diamine having a carboxylic group(s).

2. The process according to claim 1, wherein said insulating film is made of one selected from the group consisting of polyethylene terephthalate, polynaphthalene terephthalate, polyphenylene sulfide, polyphenylene ether resins, polyamide resins, aromatic polyamide resins, polyimide resins, fluorocarbon polymers and liquid crystal polymers.

3. The process according to claim 1, wherein said insulating film has a thickness of 5 μm to 500 μm.

4. The process according to claim 1, wherein said thermoplastic polyimide layer comprises a polyimide block copolymer.

5. The process according to claim 1, wherein said thermoplastic polyimide layer has a thickness of 1 μm to 20 μm.

6. The process according to claim 1, wherein a total thickness of both said first copper layer and said second copper layer is 1 μm to 40 μm.

* * * * *